(12) United States Patent
Kim et al.

(10) Patent No.: US 7,994,494 B2
(45) Date of Patent: *Aug. 9, 2011

(54) ORGANIC THIN FILM TRANSISTOR ARRAY PANEL AND METHOD FOR MANUFACTURING THE SAME

(75) Inventors: Bo-Sung Kim, Seoul (KR); Mun-Pyo Hong, Seongnam-si (KR); Yong-Uk Lee, Seongnam-si (KR); Joon-Hak Oh, Yongin-si (KR); Keun-Kyu Song, Yongin-si (KR); Seung-Hwan Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 937 days.

This patent is subject to a terminal disclaimer.

(21) Appl. No.: 11/507,095

(22) Filed: Aug. 18, 2006

(65) Prior Publication Data

US 2007/0040171 A1 Feb. 22, 2007

(30) Foreign Application Priority Data

Aug. 18, 2005 (KR) .......................... 10-2005-0075596
Apr. 26, 2006 (KR) .......................... 10-2006-0037566

(51) Int. Cl.
*H01L 27/32* (2006.01)
*G09G 3/30* (2006.01)
(52) U.S. Cl. ..................... 257/40; 257/59; 257/E27.119; 257/E51.006; 345/80
(58) Field of Classification Search .............. 257/57, 257/40, 59, 72, E27.117–E27.119, E51.005–E51.009; 345/80
See application file for complete search history.

(56) References Cited

U.S. PATENT DOCUMENTS

| | | | | |
|---|---|---|---|---|
| 5,852,482 A * | 12/1998 | Kim | ................................. | 349/46 |
| 6,639,281 B2 * | 10/2003 | Kane et al. | ..................... | 257/350 |
| 6,674,495 B1 * | 1/2004 | Hong et al. | ........................ | 349/43 |
| 6,696,370 B2 * | 2/2004 | Jackson | ........................ | 438/780 |
| 6,821,811 B2 * | 11/2004 | Hirakata et al. | ................. | 438/82 |
| 6,912,024 B2 | 6/2005 | Kim et al. | | |
| 6,921,918 B2 | 7/2005 | Park et al. | | |
| 7,015,502 B2 * | 3/2006 | Arai et al. | ........................ | 257/40 |
| 7,033,951 B2 * | 4/2006 | Kido | .............................. | 438/710 |
| 7,317,496 B2 * | 1/2008 | Kim | ................................. | 349/39 |
| 7,320,906 B2 * | 1/2008 | Park et al. | ..................... | 438/158 |
| 7,679,712 B2 * | 3/2010 | Song et al. | ..................... | 349/156 |
| 2004/0263702 A1 * | 12/2004 | Kim | ................................. | 349/38 |

(Continued)

FOREIGN PATENT DOCUMENTS

CN 1398007 A 2/2003

(Continued)

*Primary Examiner* — Matthew W Such
(74) *Attorney, Agent, or Firm* — Cantor Colburn LLP

(57) ABSTRACT

An organic thin film transistor array panel includes; a substrate, a data line formed on the substrate, a gate line intersecting the data line and including a gate electrode, a first interlayer insulating layer formed on the gate line and the data line and including a first opening exposing the gate electrode, a gate insulator formed in the first opening, a source electrode disposed on the gate insulator and connected to the data line, a pixel electrode disposed on the gate insulator and including a drain electrode opposing the source electrode, a insulating bank formed on the source electrode and the drain electrode, the insulating bank defining a second opening which exposes portions of the source electrode and the drain electrode, and an organic semiconductor formed in the second opening.

15 Claims, 16 Drawing Sheets

U.S. PATENT DOCUMENTS

| | | | |
|---|---|---|---|
| 2005/0045885 A1* | 3/2005 | Kim et al. | 257/66 |
| 2005/0110014 A1* | 5/2005 | Park et al. | 257/59 |
| 2005/0140840 A1* | 6/2005 | Hirakata et al. | 349/43 |

FOREIGN PATENT DOCUMENTS

| | | |
|---|---|---|
| JP | 11-065487 | 3/1999 |
| JP | 2000-269504 | 9/2000 |
| JP | 2001-244467 | 9/2001 |
| KR | 10-2000-0068763 | 11/2000 |
| KR | 1020040007823 | 1/2004 |
| KR | 1020050023012 | 3/2005 |

* cited by examiner

ORGANIC THIN FILM TRANSISTOR ARRAY PANEL AND METHOD FOR MANUFACTURING THE SAME

This application claims priority to Korean Patent Application No. 10-2005-0075596, filed on Aug. 18, 2005, and Korean Patent Application No. 10-2006-0037566, filed on Apr. 26, 2006, and all the benefits accruing therefrom under 35 U.S.C. §119, and the contents of which in their entirety are herein incorporated by reference.

BACKGROUND OF THE INVENTION (a) Field of the Invention

The present invention relates to an organic thin film transistor array panel and a manufacturing method thereof.

(b) Description of the Related Art

In general, a flat panel display, such as a liquid crystal display ("LCD"), an organic light emitting diode ("OLED") display, and an electrophoretic display, includes a plurality of pairs of field generating electrodes and an electro-optical active layer interposed therebetween. An LCD includes a liquid crystal layer as the electro-optical active layer, and an OLED display includes an organic emission layer as the electro-optical active layer.

One of the plurality of pairs of field generating electrodes is generally connected to a switching element to be applied with an electrical signal, and the electro-optical active layer converts the electrical signal into an optical signal, thereby displaying images.

Thin film transistors ("TFTs"), which are three-terminal elements, are used as switching elements in a flat panel display. Also provided in the flat panel display are gate lines for transmitting scanning signals to control the TFTs and data lines for transmitting signals to be applied to pixel electrodes.

Among TFTs, organic thin film transistors (OTFTs) using an organic semiconductor instead of an inorganic semiconductor such as silicon (Si) have been vigorously researched.

OTFTs can be easily applied to large-sized flat panel displays. The only limiting factors in OTFT fabrication are the deposition processes in which the OTFT must be formed. In particular, OTFTs may be fabricated at a low temperature by a solution process; therefore even with their limitations they are potentially advantageous. The ability to fabricate an OTFT substrate at low temperature and by a solution process allows them to be more easily manufactured, as compared to a process requiring heating or chemical development. Moreover, since an OTFT can be fabricated in the form of a fiber or a film due to the flexible characteristics of the organic material, it has been in the spotlight as a core element of a flexible display device.

However, organic semiconductors may be easily damaged during the manufacturing process due to their weak chemical resistance. Therefore, a different structure from pre-existing TFTs is required.

Also, since an organic semiconductor has a low current ratio (I-on/I-off) compared to an inorganic semiconductor, ways to improve this problem are also required.

BRIEF SUMMARY OF THE INVENTION

The present invention has been made in an effort to provide an organic thin film transistor array panel and a manufacturing method thereof having advantages of improving characteristics of a TFT and preventing an organic semiconductor from being damaged during the manufacturing processes of the thin film transistor array panel.

According to exemplary embodiments of the present invention, the above-mentioned problems are solved and an organic semiconductor is prevented from being damaged during the manufacturing processes and in addition the characteristics of a TFT are improved.

An exemplary embodiment of an organic thin film transistor array panel according to the present invention comprises; a substrate, a data line formed on the substrate, a gate line intersecting the data line and including a gate electrode, a first interlayer insulating layer formed on the gate line and the data line and including a first opening exposing the gate electrode, a gate insulator formed in the first opening, a source electrode disposed on the gate insulator and connected to the data line, a pixel electrode disposed on the gate insulator and including a drain electrode opposing the source electrode, an insulating bank formed on the source electrode and the drain electrode, the insulating bank defining a second opening which exposes at least portions of the source electrode and the drain electrode, and an organic semiconductor formed in the second opening.

In another exemplary embodiment, the second opening may be smaller than the first opening.

In another exemplary embodiment, the dielectric constant of the gate insulator may be greater than the dielectric constant of the first interlayer insulating layer.

In another exemplary embodiment, the gate insulator may comprise at least one selected from the group consisting of a polyimide, a polyvinyl alcohol, and a fluorane-containing compound.

In another exemplary embodiment, the first interlayer insulating layer may comprise at least one selected from the group consisting of a polyacryl, a polystyrene, silicon oxide, silicon nitride, benzocyclobutane, and parylene.

In another exemplary embodiment, the organic thin film transistor array panel may further comprise a stopper formed on the organic semiconductor.

In another exemplary embodiment, the stopper may comprise a fluorine-containing hydrocarbon compound or a polyvinyl alcohol.

In another exemplary embodiment, the organic thin film transistor array panel may further comprise a storage electrode line including a portion at least partially overlapping the pixel electrode, the storage electrode line extending parallel to one of the data line and the gate line.

In another exemplary embodiment, the first interlayer insulating layer may be partially removed above the storage electrode.

In another exemplary embodiment, the organic thin film transistor array panel may further comprise a second interlayer insulating layer disposed between the storage electrode line and the pixel electrode.

In another exemplary embodiment, the first interlayer insulating layer may comprise an organic material and the second interlayer insulating layer may comprise an inorganic material.

In another exemplary embodiment, the organic thin film transistor array panel may further comprise a conductor connected to the pixel electrode and overlapping a portion of the storage electrode line.

In another exemplary embodiment, at least one of the first interlayer insulating layer, the gate insulator, the insulating bank, and the organic semiconductor may comprise a soluble material.

In another exemplary embodiment, at least one of the first interlayer insulating layer and the insulating bank may comprise a photosensitive organic material.

In another exemplary embodiment, the source electrode and the pixel electrode may comprise indium tin oxide ("ITO") or indium zinc oxide ("IZO").

An exemplary embodiment of a method for manufacturing an organic thin film transistor array panel according to the present invention comprises; forming a data line on a substrate, forming a first insulating layer on the data line and the substrate, forming a gate line including a gate electrode on the first insulating layer, forming a second insulating layer on the gate line and the first insulating layer, forming a first opening in the second insulating layer which exposes the gate electrode, forming a gate insulator in the first opening, forming a source electrode connected to the data line and a pixel electrode including a drain electrode opposing the source electrode on the gate insulator, forming an insulating bank including a second opening on the source electrode and the pixel electrode, and forming an organic semiconductor in the second opening.

In another exemplary embodiment, the forming of the insulating bank including a second opening creates a second opening which may be smaller than the first opening.

In another exemplary embodiment, the method for manufacturing an organic thin film transistor array panel may further comprise forming a stopper which covers the organic semiconductor after the formation of the organic semiconductor.

In another exemplary embodiment, at least one of the formation of the first insulating layer, the formation of the gate insulator, the formation of the insulating bank, the formation of the organic semiconductor, and the formation of the stopper may be performed by a solution process.

In another exemplary embodiment, at least one of the formation of the gate insulator and the formation of the organic semiconductor may be performed by an inkjet printing process.

DETAILED DESCRIPTION OF THE INVENTION

Figure 1:
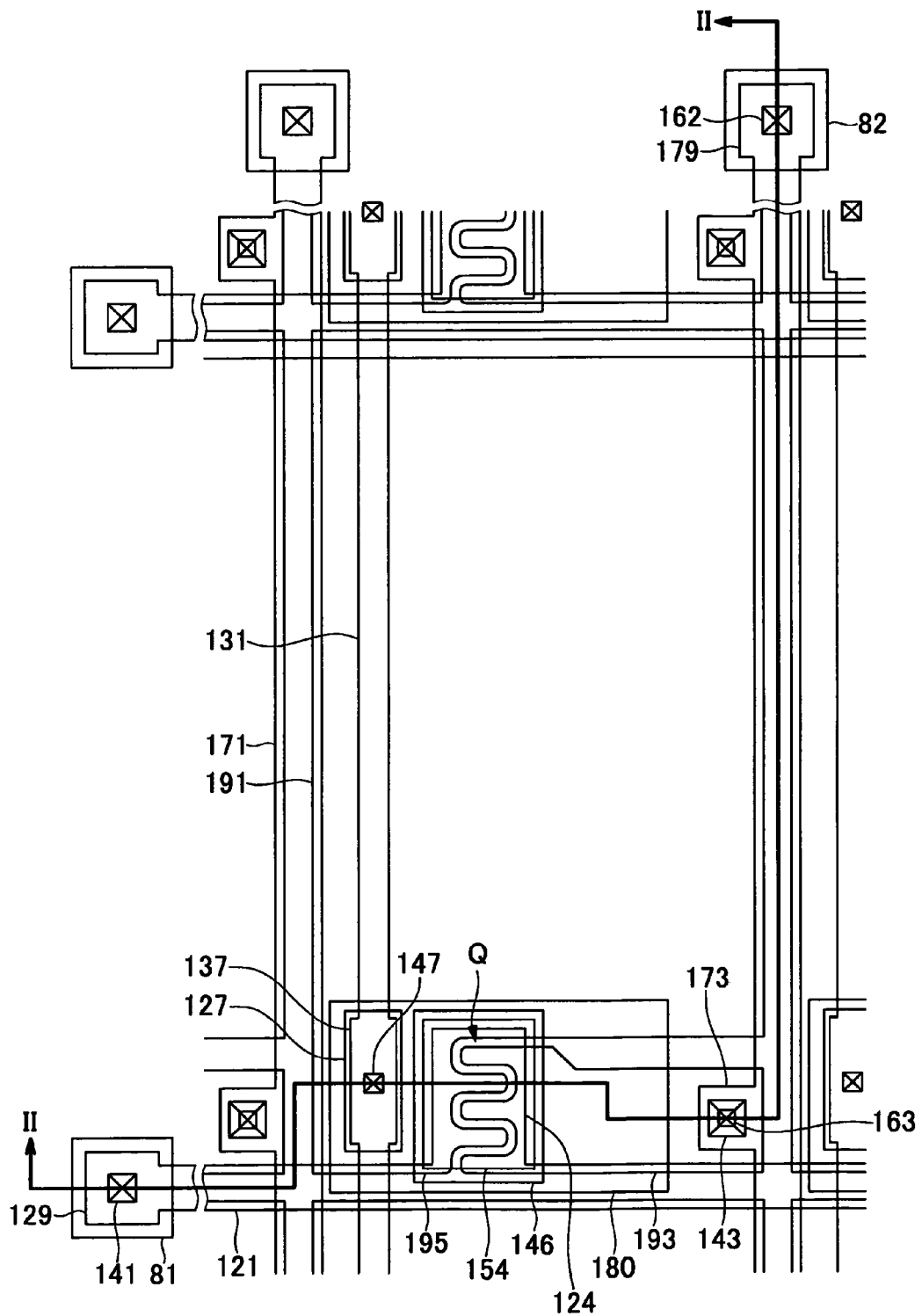
FIG. 1 is a top plan view layout of an exemplary embodiment of an OTFT array panel according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

[The above paragraph may be replaced with the following] Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Exemplary Embodiment 1

Now, an OTFT array panel according to an exemplary embodiment of the present invention will be described in detail with reference to FIG. 1 and FIG. 2.

Figure 2:
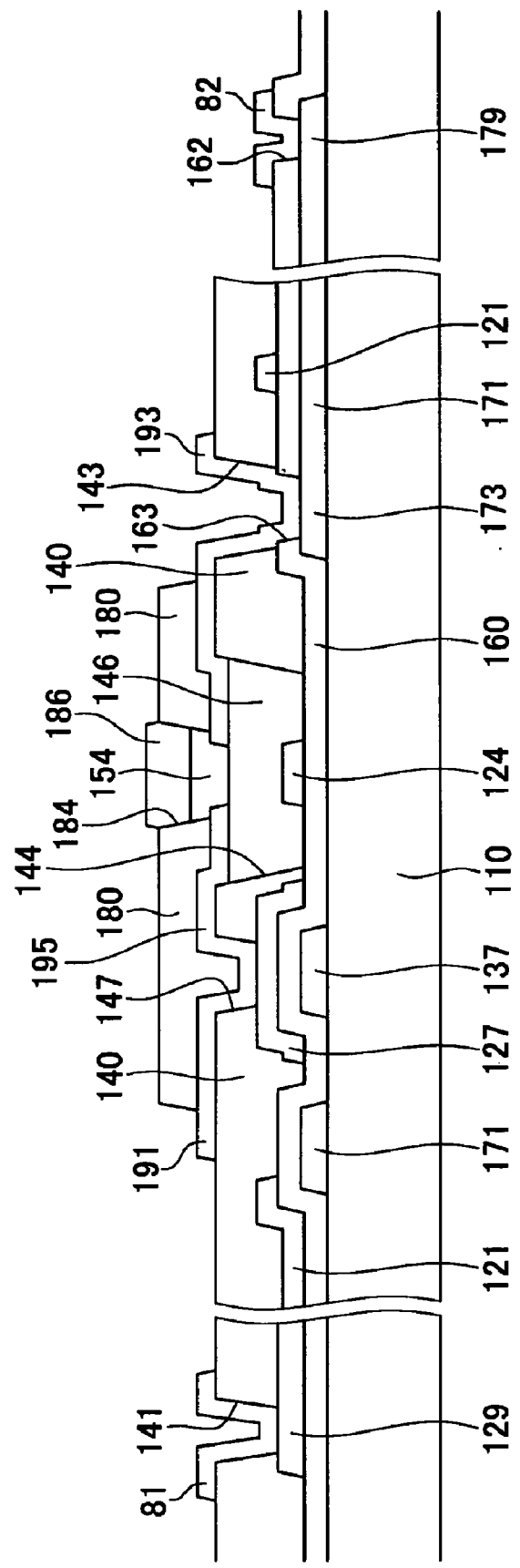
FIG. 2 is a cross-sectional view of the exemplary embodiment of an OTFT array panel shown in FIG. 1 taken along line II-II.

FIG. 1 is a top plan view layout of an exemplary embodiment of an OTFT array panel according to the present invention, and FIG. 2 is a cross-sectional view of the exemplary embodiment of an OTFT array panel shown in FIG. 1 taken along line II-II.

A plurality of data lines 171 and a plurality of storage electrode lines 131 are formed on an insulating substrate 110. The transparent substrate 110 may be made of transparent glass although alternative embodiments include configurations where it is made of silicone or plastic.

The data lines 171 transmit data signals and extend substantially in the longitudinal direction. Each data line 171 includes a plurality of projections 173 protruding to one side and an end portion 179 having a large area for connection with another layer or an external driving circuit (not shown). A data driving circuit (not shown) for generating data signals may be mounted on a flexible printed circuit ("FPC") film (not shown), which may be attached to the substrate 110, directly mounted on the substrate 110, or integrated with the substrate 110. When the data driving circuit is integrated with the substrate 110, the data lines 171 may extend to be directly connected to the data driving circuit.

The storage electrode lines 131 are applied with a predetermined voltage and extend substantially parallel to the data lines 171. Each storage electrode line 131 is disposed between two data lines 171, and may be placed closer to either one of the two data lines 171. In this exemplary embodiment, the storage electrode line 131 is closer to the left one of the two data lines 171. Each storage electrode line 131 includes storage electrodes 137 extending laterally from the electrode line 131. However, the shapes and disposition of the storage electrode lines 131 may be modified in various ways.

The data lines 171 and the storage electrode lines 131 may be made of aluminum (Al) or an alloy containing Al, silver (Ag) or an alloy containing Ag, gold (Au) or an alloy containing Au, copper (Cu) or an alloy containing Cu, molybdenum (Mo) or an alloy containing Mo, chromium (Cr), tantalum (Ta) or titanium (Ti). Alternatively, the data lines 171 and the storage electrode lines 131 may have a multi-layered structure including two conductive layers (not shown) having different physical properties. The lateral sides of the data lines 171 and the storage electrode lines 131 are inclined relative to a surface of the substrate 110, and the inclination angles thereof may be in a range of about 30 degrees to about 80 degrees.

A lower interlayer insulating layer 160 is formed on the data lines 171 and the storage electrode lines 131. The lower interlayer insulating layer 160 may be made of an inorganic insulator such as silicon nitride ("SiNx") or silicon oxide ("SiO2"). The thickness of the lower interlayer insulating layer 160 may be about 0.2 μm to about 4 μm.

The lower interlayer insulating layer 160 may have a plurality of contact holes 163 and 162 exposing the projections 173 and the end portions 179 of the data lines 171, respectively.

A plurality of gate lines 121 and a plurality of storage capacitor conductors 127 are formed on the lower interlayer insulating layer 160.

The gate lines 121 for transmitting gate signals extend substantially a direction which is substantially transverse to, and intersecting with, the data lines 171 and the storage electrode lines 131. Each of the gate lines 121 includes a plurality of gate electrodes 124 protruding perpendicular to the rest of the gate line and an end portion 129 having a large area for connection with another layer or an external driving circuit. A gate driving circuit (not shown) for generating gate signals may be mounted on a flexible printed circuit film (not shown), which is attached to the substrate 110, directly mounted on the substrate 110, or integrated with the substrate 110. When the gate driving circuit is integrated with the substrate 110, the gate lines 121 may extend to be directly connected to the gate driving circuit.

Each storage capacitor conductor 127 is separated from the gate lines 121 and overlaps a storage electrode 137.

The gate lines 121 and the storage capacitor conductors 127 may be made of the same material as the data lines 171 and the storage electrode lines 131. The lateral sides of the gate lines 121 and the storage capacitor conductors 127 are also inclined relative to a surface of the substrate 110, and the inclination angle thereof ranges from about 30 degrees to about 80 degrees.

An upper interlayer insulating layer 140 is formed on the gate lines 121 and the storage capacitor conductor 127. The upper interlayer insulating layer 140 is made of an organic material having a relatively low dielectric constant of about 2.5 to 4.0. Exemplary embodiments of the organic material include a soluble high molecular compound such as a polyacryl, a polystyrene, and benzocyclobutane ("BCB"). The thickness of the upper interlayer insulating layer 140 may be about 0.5 µm to about 4 µm.

Placing the upper interlayer insulating layer 140 having a low dielectric constant on the gate lines 121 and the storage conductors 127 reduces or effectively prevents parasitic capacitance between the data lines 171 and/or the gate lines 121 and an upper conductive layer.

The upper interlayer insulating layer 140 is not formed around the end portions 179 of the data lines 171. This is in order to prevent separation of the upper interlayer insulating layer 140 and the lower interlayer insulating layer 160 formed on the end portions 179 of the data lines 171 which is caused by poor adhesion between the two materials, and to reduce the thickness of the interlayer insulating layer so that the end portions 179 of the data lines 171 are effectively connected to the external circuit.

The upper interlayer insulating layer 140 has a plurality of openings 144 exposing the gate electrodes 124, a plurality of contact holes 141 exposing the end portions 129 of the gate lines 121, a plurality of contact holes 143 exposing the projections 173 of the data lines 171, and a plurality of contact holes 147 exposing the storage capacitor conductors 127.

Gate insulators 146 are formed in the openings 144 of the upper interlayer insulating layer 140. Each gate insulator 146 covers a gate electrode 124, and its thickness is about 0.1 µm to about 1 µm. The sidewall of the opening 144 is higher than the gate insulator 146 so that the upper interlayer insulating layer 140 functions as a bank, and the size of the opening 144 is large enough that the surface of the gate insulator 146 can be substantially flat. If the size of the opening 144 is too small, a meniscus is formed so that the gate insulator 146 will have a convex or concave shape.

The gate insulator 146 is made of an organic material or an inorganic material having a relatively high dielectric constant of about 3.5 to about 10. Exemplary embodiments of the organic material include a soluble high molecular compound such as a polyimide, a polyvinyl alcohol, a fluorane-containing compound, and parylene, and an exemplary embodiment of the inorganic material is silicon oxide which has a surface treated with octadecyl trichloro silane ("OTS"). Particularly, it is preferable that the dielectric constant of the gate insulator 146 is greater than that of the upper interlayer insulating layer 140.

By providing gate insulators 146 having a high dielectric constant as described above, a threshold voltage of an OTFT can be decreased while a current amount (I-on) is increased, thereby improving the efficiency of the OTFT.

A plurality of source electrodes 193, a plurality of pixel electrodes 191, and a plurality of contact assistants 81 and 82 are formed on the upper interlayer insulating layer 140, the lower interlayer insulating layer 160, and the gate insulators 146. They may be made of a transparent conductive material such as IZO or ITO, and their thickness may be about 0.03 µm to about 0.1 µm.

The source electrodes 193 are connected to the data lines 171 at the projections of the data line 173 through the contact holes 143 and they extend toward the gate electrodes 124.

Each pixel electrode 191 includes a portion 195 (hereinafter, referred to as a "drain electrode") disposed opposite a source electrode 193 with respect to a gate electrode 124 and is connected to a storage capacitor conductor 127 through the contact hole 147. The opposing edges of the drain electrode 195 and the source electrode 193 are parallel to each other and are intertwined such that protrusions on the drain electrode correspond to indentations in the source electrode and vice versa. The pixel electrodes 191 overlap the gate lines 121 and/or the data lines 171 to increase the aperture ratio.

The contact assistants 81 and 82 are connected to the end portions 129 of the gate lines 121 and the end portions 179 of the data lines 171 through the contact holes 141 and 162, respectively. The contact assistants 81 and 82 protect the end portions 129 of the gate lines 121 and the end portions 179 of the data lines 171 and enhance the adhesion between the end portions 129 and 179 and external devices.

A plurality of insulating banks 180 are formed on the source electrodes 193, the pixel electrodes 191, and the upper interlayer insulating layer 140. Each insulating bank 180 confines an organic semiconductor 154 to be described below.

Each insulating bank 180 has a plurality of openings 184. Each opening 184 is disposed on an opening 144 of the upper interlayer insulating layer 140 and a gate electrode 124, and exposes portions of the source electrode 193 and the drain electrode 195 and the gate insulator 146 therebetween.

The insulating banks 180 are made of a photosensitive organic material which can be processed by a solution process, the thickness of which may be about 0.5 µm to about 4 µm. The opening 184 of the insulating bank 180 is smaller than the opening 144 of the upper interlayer insulating layer 140. In this way, removal of, or damage to, the gate insulators 146 can be prevented because the insulating banks 180 overlap and tightly fix the underlying gate insulators 146, leaving only a narrow channel of access to the gate insulators 146. Because of the narrow channel, penetration of chemical solutions in subsequent processes can be prevented.

A plurality of organic semiconductor islands 154 are formed in the openings 184 of the insulating banks 180. The organic semiconductor islands 154 are disposed on the gate electrodes 124 and contact the source electrodes 193 and the drain electrodes 195, and the organic semiconductor islands 154 are completely confined by the insulating banks 180 because the height of the organic semiconductor islands 154 is lower than that of the insulating banks 180. Because of this configuration, the organic semiconductor islands 154 are completely confined by the insulating banks 180 so that the lateral sides of the organic semiconductor islands 154 are not exposed. This configuration prevents penetration of chemicals into the lateral sides of the organic semiconductor islands 154 in subsequent processes.

The organic semiconductor islands 154 may include a high molecular weight compound or a low molecular weight compound. The high molecular weight compounds are soluble in an organic solvent and the low molecular weight compounds are soluble in an aqueous solution. Because of this the organic semiconductor islands 154 may be formed by inkjet printing. However, the organic semiconductor islands 154 may be formed by deposition or another solution process such as spin coating or slit coating. When not using an inkjet method the insulating banks 180 can be omitted.

The organic semiconductor islands 154 may include a derivative of tetracene or pentacene with a substituent. The organic semiconductor islands 154 may also include oligothiophene including four to eight thiophenes connected at the positions 2, 5 of thiophene rings.

The organic semiconductor islands 154 may include polythienylenevinylene, poly 3-hexylthiophene, polythiophene, phthalocyanine, metallized phthalocyanine, or halogenated derivatives thereof. The organic semiconductor islands 154 may also include perylenetetracarboxylic dianhydride ("PTCDA"), naphthalenetetracarboxylic dianhydride ("NTCDA"), or imide derivatives thereof. The organic semiconductor islands 154 may include perylene, coronene, or derivatives thereof with a substituent.

The thickness of the organic semiconductors may be about 0.03 μm to 0.3 μm.

A gate electrode 124, a source electrode 193, and a drain electrode 195 along with an organic semiconductor island 154 form a TFT Q having a channel formed in the organic semiconductor island 154 disposed between the source electrode 193 and the drain electrode 195.

The pixel electrodes 191 receive data voltages from the TFTs Q and generate an electric field in cooperation with a common electrode (not shown) of an opposing display panel (not shown) supplied with a common voltage, which determines the orientation of liquid crystal molecules (not shown) in a liquid crystal layer (not shown) interposed between the two electrodes. A pixel electrode 191 and the common electrode form a capacitor (hereinafter, referred to as a "liquid crystal capacitor"), which stores and preserves the applied voltage even after the TFT is turned off.

Stoppers 186 are formed on the organic semiconductor islands 154. In one exemplary embodiment, the stoppers 186 are made of a fluorine-containing hydrocarbon compound or a polyvinyl alcohol. The stoppers 186 protect the organic semiconductor islands 154 from external heat, plasma, or chemical materials.

A passivation layer (not shown) for enhancing the protection of the organic semiconductor islands 154 may be formed on the stoppers 186.

Now, a manufacturing method of the OTFT shown in FIG. 1 and FIG. 2 according to an exemplary embodiment of the present invention will be described in detail with reference to FIG. 3 through FIG. 12.

Figure 3:
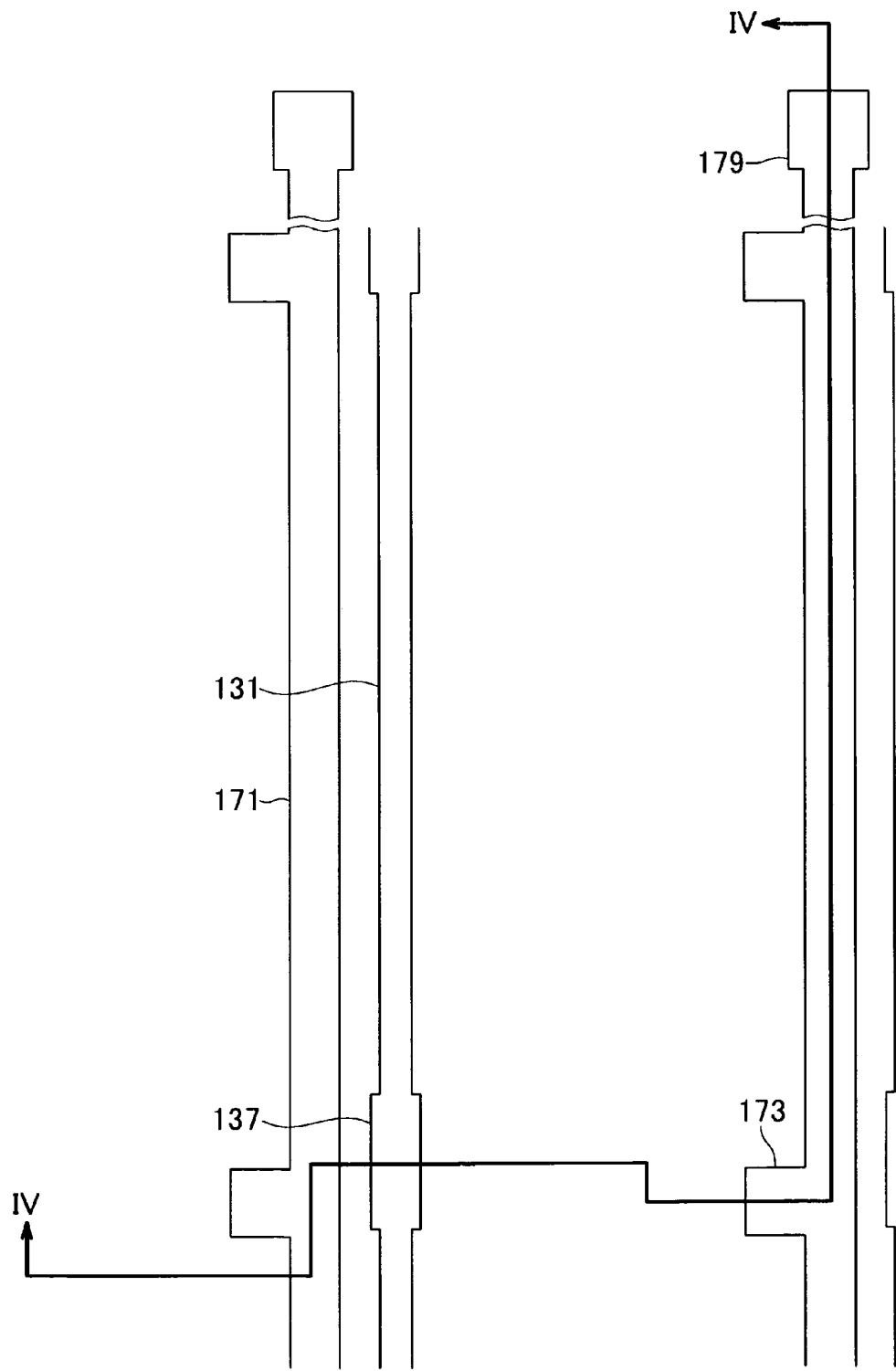
FIG. 3 is a top plan view layout of an exemplary embodiment of a step in the manufacture of the OTFT array panel shown in FIG. 1 and FIG. 2 according to the present invention.
Figure 4:
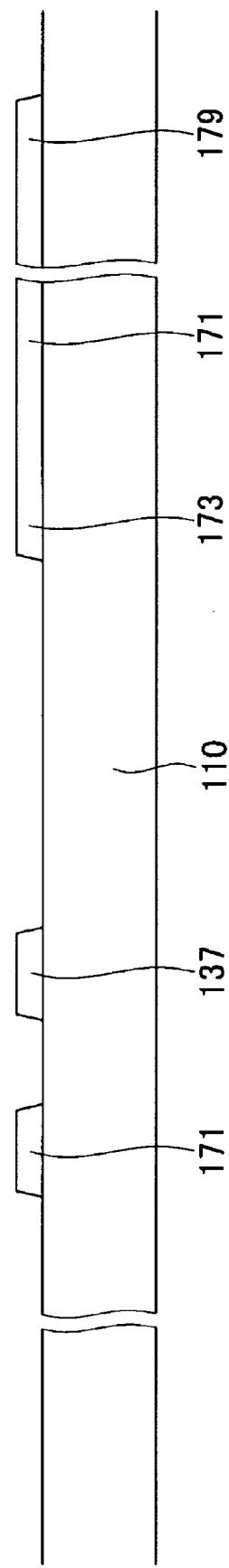
FIG. 4 is a cross-sectional view of the exemplary embodiment of a step in the manufacture of the OTFT array panel shown in FIG. 3 taken along line IV-IV.

FIG. 3, FIG. 5, FIG. 7, FIG. 9 and FIG. 11 are top plan view layouts of the exemplary embodiment of the OTFT array panel shown in FIG. 1 and FIG. 2 in intermediate steps of a manufacturing method thereof according to the present invention. FIG. 4 is a cross-sectional view of the exemplary embodiment of a step in the manufacture of the OTFT array panel shown in FIG. 3 taken along line IV-IV, FIG. 6 is a cross-sectional view of the exemplary embodiment of a step in the manufacture of the OTFT array panel shown in FIG. 5 taken along line VI-VI, FIG. 8 is a cross-sectional view of the exemplary embodiment of a step in the manufacture of the OTFT array panel shown in FIG. 7 taken along line VIII-VIII, FIG. 10 is a cross-sectional view of the exemplary embodiment of a step in the manufacture of the OTFT array panel shown in FIG. 9 taken along line X-X and FIG. 12 is a cross-sectional view of the exemplary embodiment of a step in the manufacture of the OTFT array panel shown in FIG. 11 taken along line XII-XII.

First, a conductive layer is deposited on a substrate 110. One exemplary embodiment of the method of deposition is sputtering and patterning by photolithography and etching. The conductive layer forms a plurality of data lines 171 including projections 173 and end portions 179 and a plurality of storage electrode lines 131 including storage electrodes 137 as illustrated in FIG. 3 and FIG. 4.

Figure 5:
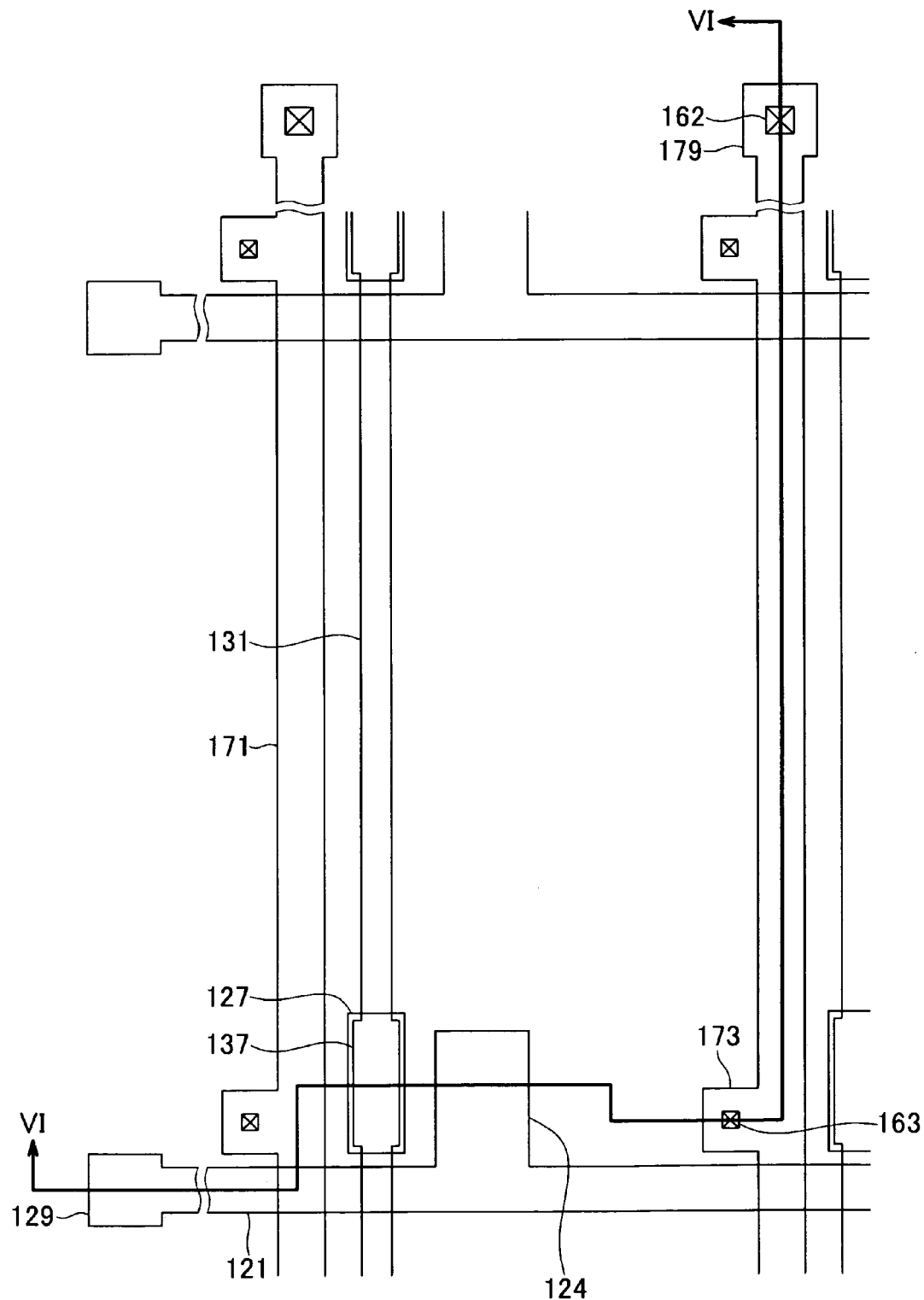
FIG. 5 is a top plan view layout of an exemplary embodiment of a step in the manufacture of the OTFT array panel shown in FIG. 1 and FIG. 2 according to the present invention.
Figure 6:
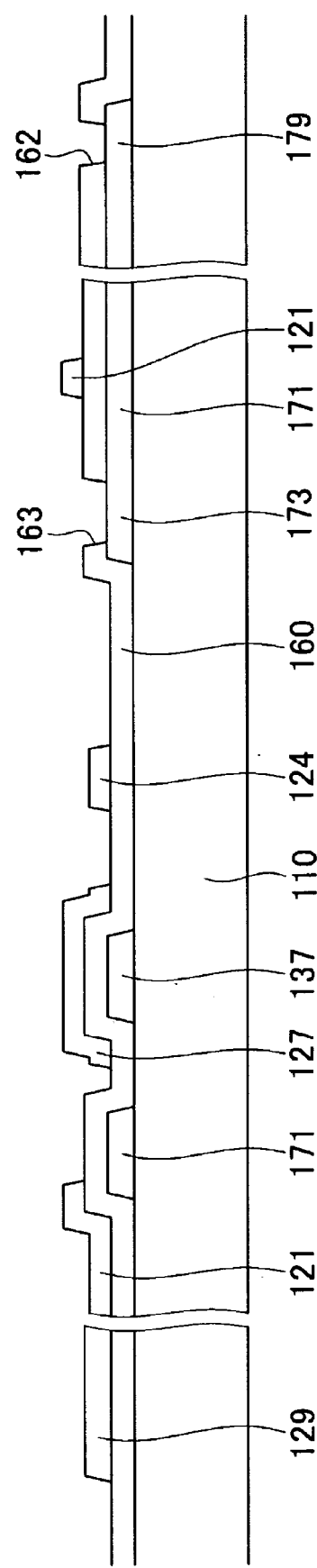
FIG. 6 is a cross-sectional view of the exemplary embodiment of a step in the manufacture of the OTFT array panel shown in FIG. 5 taken along line VI-VI.

Next, referring to FIG. 5 and FIG. 6, a lower interlayer insulating layer 160 with contact holes 162 and 163 is formed by chemical vapor deposition ("CVD") of an inorganic material or by spin coating of an organic material. When the lower interlayer insulating layer is formed from an inorganic material the contact holes 163 and 162 are formed by a photolithography and etching process using a photosensitive film; when the lower interlayer insulating layer is instead formed from an inorganic material the contact holes 163 and 162 may be formed by a photolithography process.

Next, a conductive layer is deposited on the lower interlayer insulating layer 160 and patterned by photolithography and etching to form gate lines 121 including gate electrodes 124 and end portions 129, and storage capacitor conductors 127.

Figure 7:
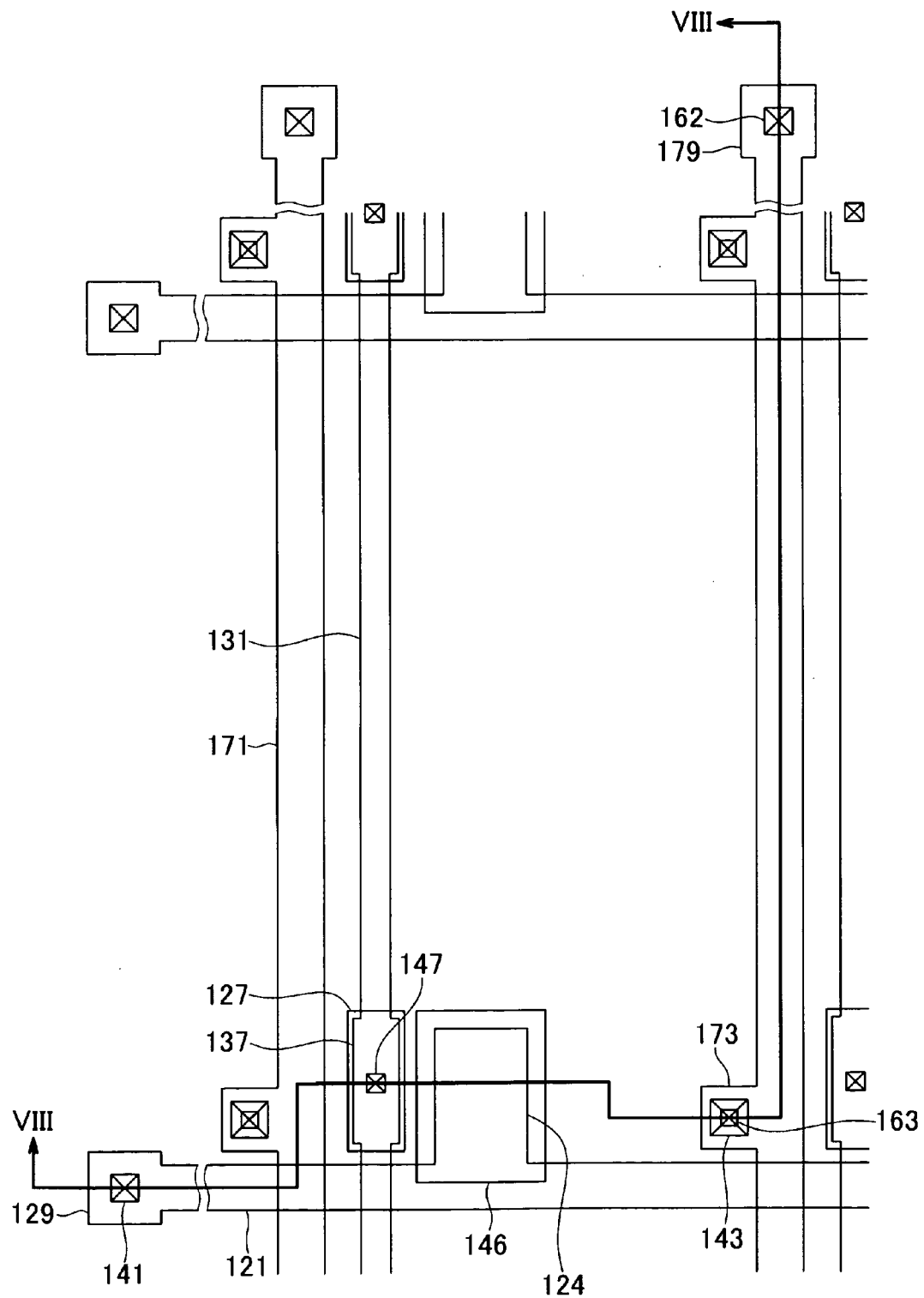
FIG. 7 is a top plan view layout of an exemplary embodiment of a step in the manufacture of the OTFT array panel shown in FIG. 1 and FIG. 2 according to the present invention.
Figure 8:
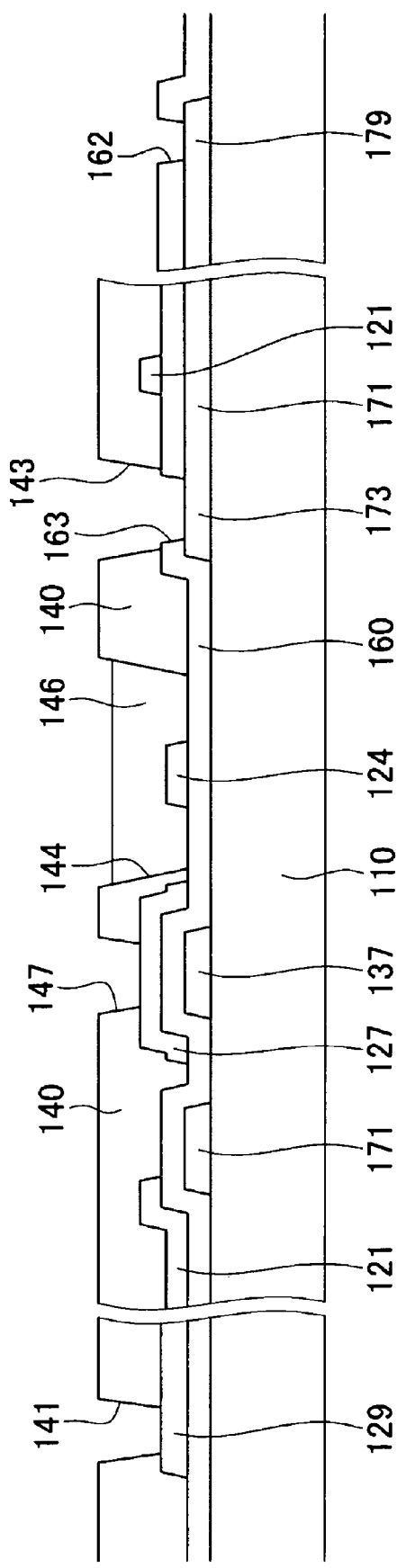
FIG. 8 is a cross-sectional view of the exemplary embodiment of a step in the manufacture of the OTFT array panel shown in FIG. 7 taken along line VIII-VIII.

Then, referring to FIG. 7 and FIG. 8, an upper interlayer insulating layer 140 including upper sidewalls of openings 144 and contact holes 141, 143, and 147 is formed by spin coating and patterning of a photosensitive organic material. Here, all organic material around the end portions 179 of the data lines 171 is removed.

Next, gate insulators 146 are formed in the openings 144 of the upper interlayer insulating layer 140. One exemplary embodiment of forming the gate insulators 146 is by an inkjet printing process. When the gate insulators 146 are formed by an inkjet printing process, an ink is dripped into the openings 144 and then dried. Alternative configurations include embodiments where the gate insulators 146 are formed by various solution processes such as spin coating and slit coating, or deposition.

Figure 9:
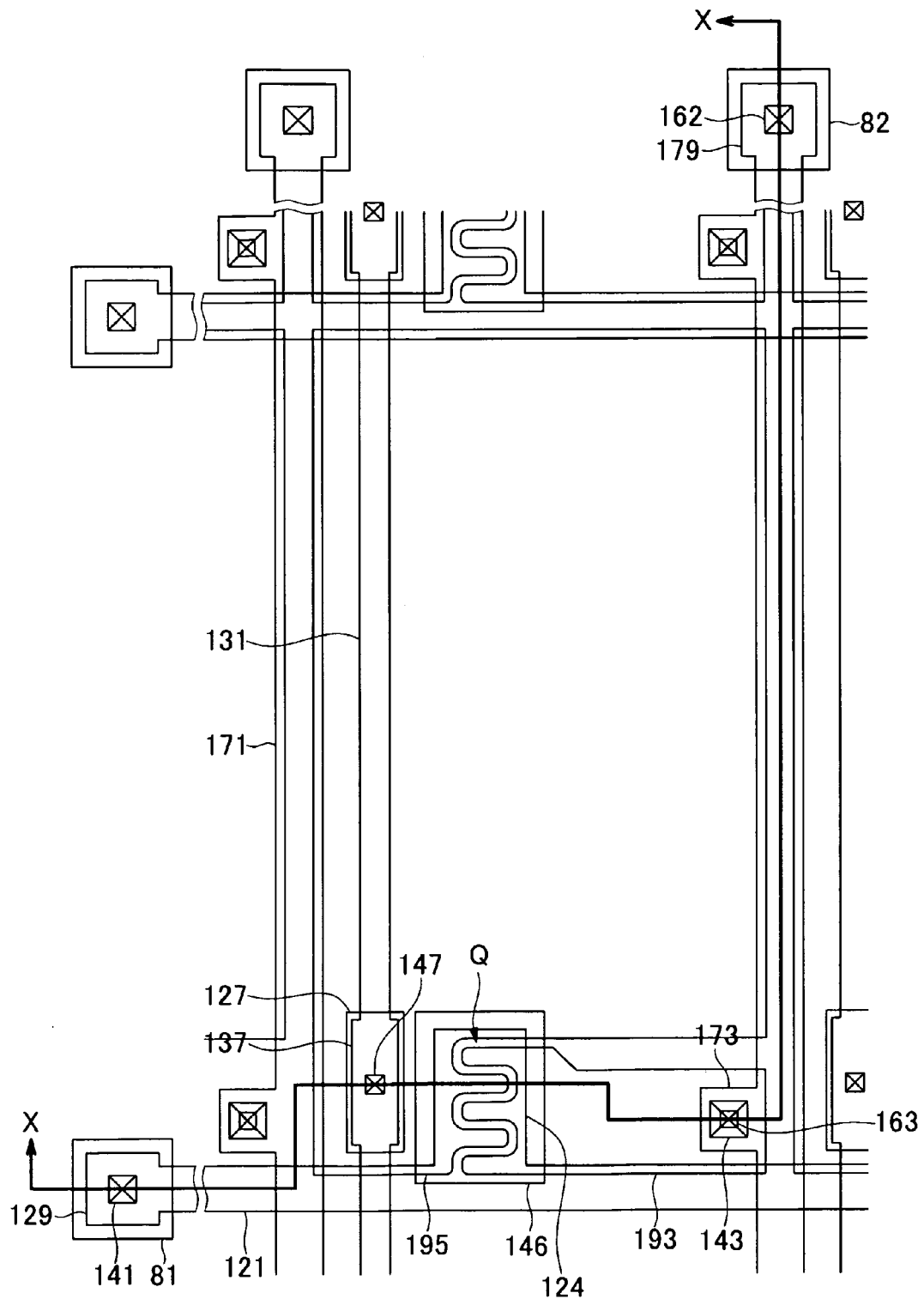
FIG. 9 is a top plan view layout of an exemplary embodiment of a step in the manufacture of the OTFT array panel shown in FIG. 1 and FIG. 2 according to the present invention.
Figure 10:
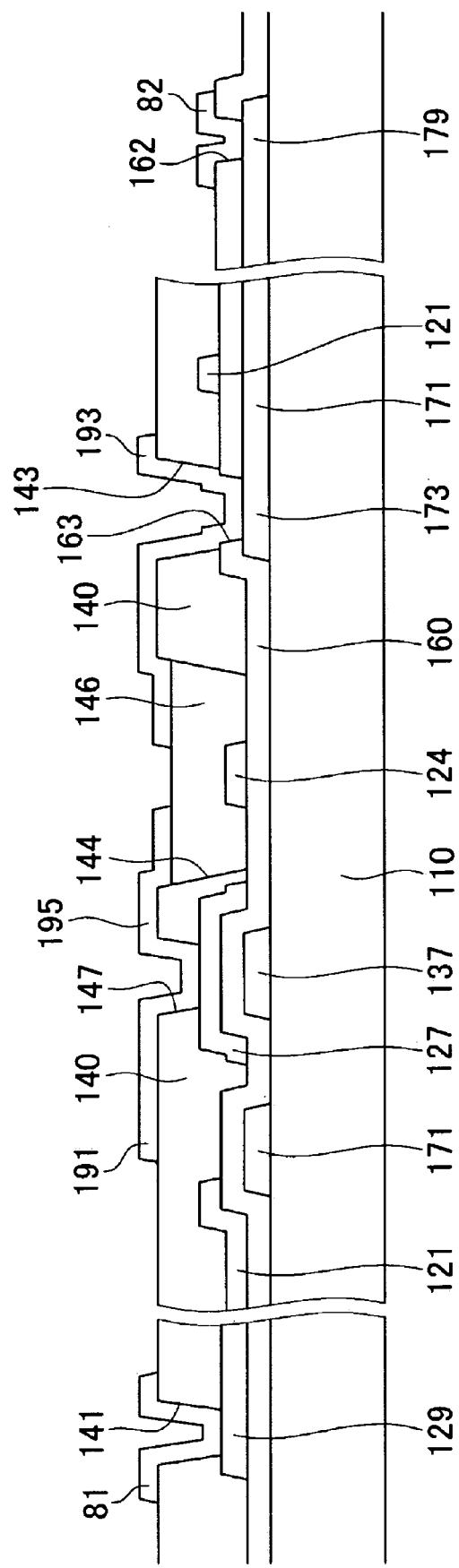
FIG. 10 is a cross-sectional view of the exemplary embodiment of a step in the manufacture of the OTFT array panel shown in FIG. 9 taken along line X-X.

Referring to FIG. 9 and FIG. 10, an amorphous ITO layer is deposited by sputtering and patterned by photolithography and etching to form pixel electrodes 191 including data electrodes 195, source electrodes 193, and contact assistants 81 and 82. The sputtering is performed at a low temperature ranging from 25° C. to 130° C., particularly at room temperature, and the etching of the amorphous ITO layer is performed using a weak basic etchant. In this way, since the ITO layer is formed at a low temperature and etched with a weak basic etchant, the underlying gate insulators 146 and the upper interlayer insulating layer 140, which are made of organic materials, can be prevented from being damaged due to heat and chemical liquids.

Figure 11:
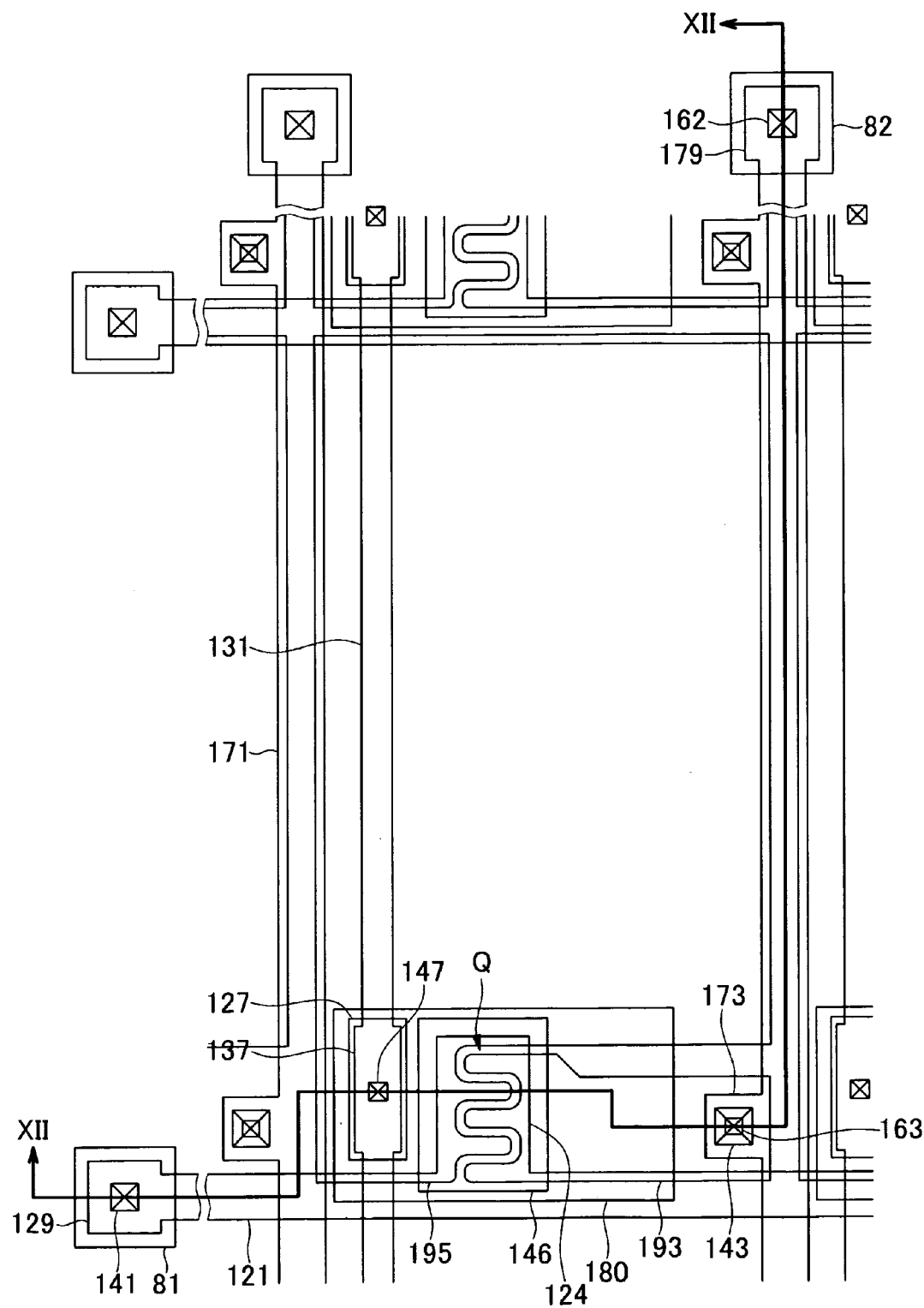
FIG. 11 is a top plan view layout of an exemplary embodiment of a step in the manufacture of the OTFT array panel shown in FIG. 1 and FIG. 2 according to the present invention.
Figure 12:
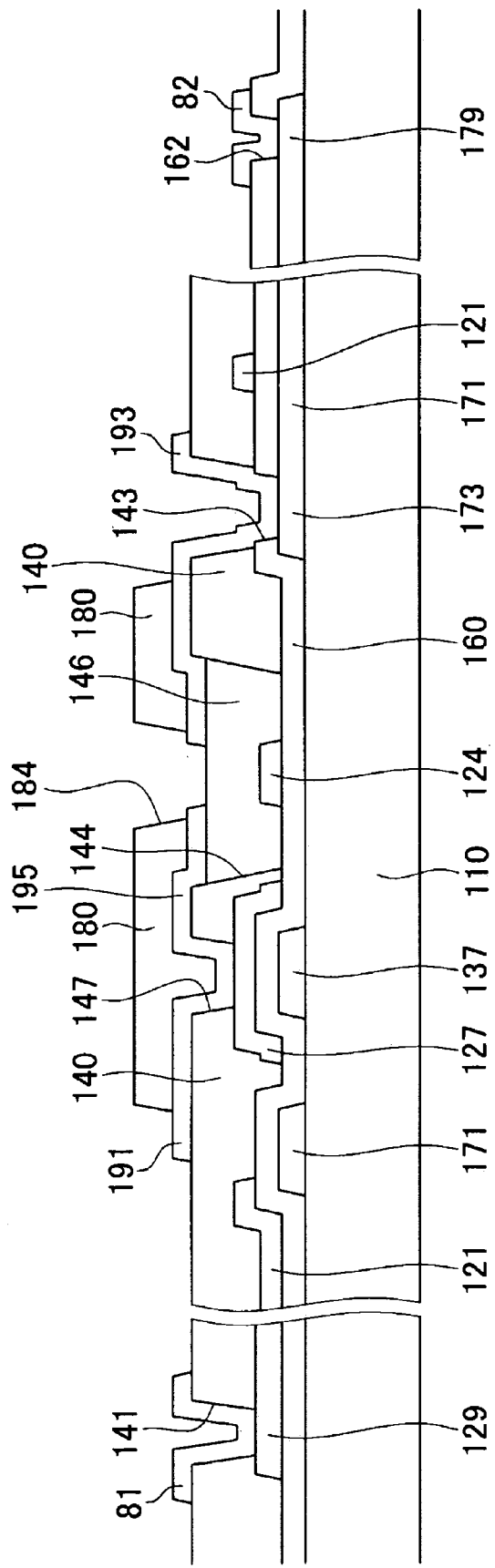
FIG. 12 is a cross-sectional view of the exemplary embodiment of a step in the manufacture of the OTFT array panel shown in FIG. 11 taken along line XII-XII.

Next, as illustrated in FIG. 11 and FIG. 12, the insulating banks 180 including openings 184 are formed by coating and developing a photosensitive organic film.

Then, as illustrated in FIG. 1 and FIG. 2, organic semiconductor islands 154 are formed in the openings 184, in one exemplary embodiment they are formed by an inkjet printing process, and stoppers 186 are sequentially formed on the organic semiconductor islands 154.

According to an exemplary embodiment of the present invention, the upper interlayer insulating layer 140 and the gate insulators 146 may be formed with appropriate materials for each use and by proper methods, respectively. For example, the upper interlayer insulating layer 140 may be made of a material having a relatively low dielectric constant in order to reduce parasitic capacitance, and the gate insulators 146 may be made of a material which can improve the characteristics of the OTFT and may be formed locally between the gate electrodes 124 and the source electrodes 193 and drain electrodes 195 in consideration of the parasitic capacitance.

As described above, by forming organic semiconductors after forming a conductive layer and an insulating layer, the organic semiconductors are prevented from being exposed to heat or chemical liquids during the forming processes. Additionally, effects on the organic semiconductors during formation of the OTFT can be minimized by including stoppers and insulating banks to confine regions where the organic semiconductors are formed. Moreover, by forming a gate insulator and an interlayer insulating layer in the same layer with different materials having different dielectric constants, parasitic capacitance is decreased while the characteristics of the OTFT are improved.

Exemplary Embodiment 2

Hereinafter, an OTFT array panel according to another exemplary embodiment of the present invention will be described in detail with reference to FIG. 13 and FIG. 14. The aspects of the two exemplary embodiments which share the same descriptions as the previously described exemplary embodiment will be omitted.

Figure 13:
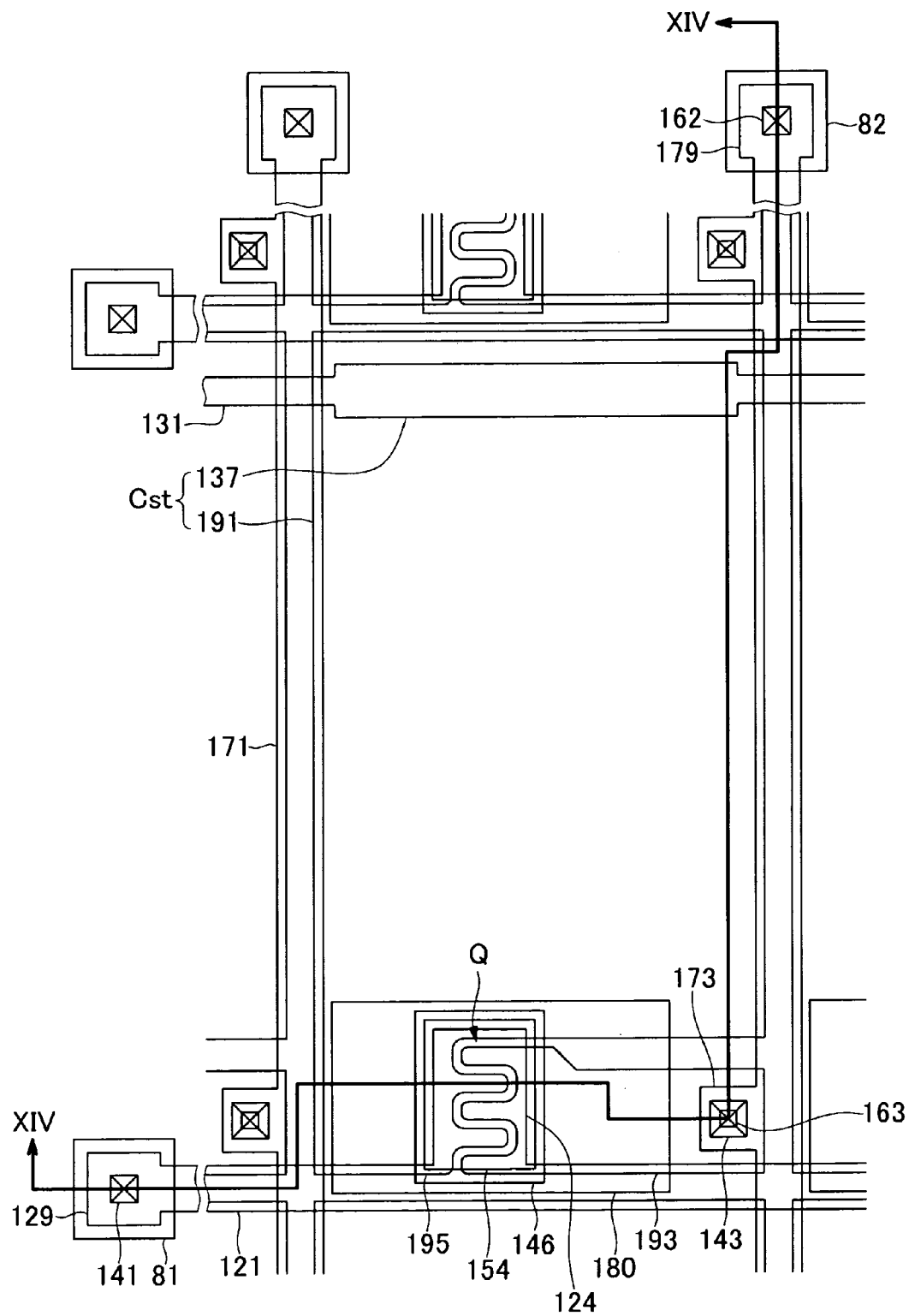
FIG. 13 is a top plan view layout of an exemplary embodiment of an OTFT array panel according to the present invention.
Figure 14:
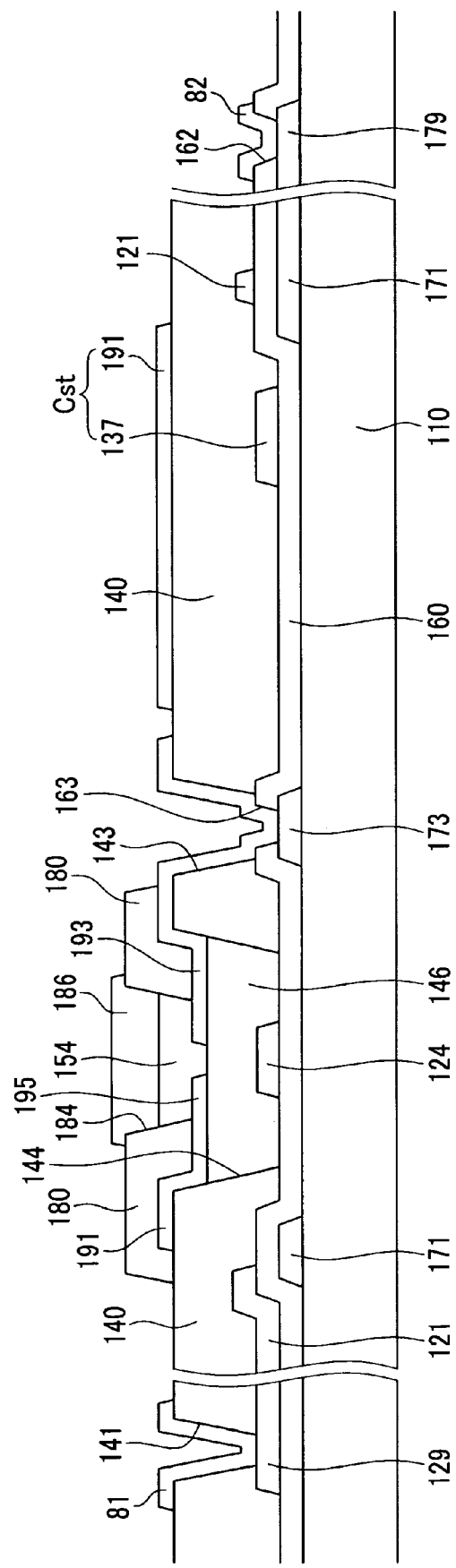
FIG. 14 is a cross-sectional view of the exemplary embodiment of an OTFT array panel shown in FIG. 13 taken along line XIV-XIV.

FIG. 13 is a top plan view layout of an OTFT array panel according to another exemplary embodiment of the present invention, and FIG. 14 is a cross-sectional view of the exemplary embodiment of an OTFT array panel shown in FIG. 13 taken along line XIV-XIV.

A plurality of data lines 171 including a plurality of projections 173 and end portions 179 are formed on an insulating substrate 110.

A lower interlayer insulating layer 160 having a plurality of contact holes 163 and 162 respectively exposing the projections 173 and the end portions 179 of the data lines 171 is formed on the data lines 171.

A plurality of gate lines 121 and a plurality of storage electrode lines 131 are formed on the lower interlayer insulating layer 160.

The storage electrode lines 131 are applied with a predetermined voltage and extend substantially parallel to the gate lines 121. Each storage electrode line 131 is disposed between two gate lines 121, closer to either one of the two gate lines 121. In this exemplary embodiment, the storage electrode line 131 is closer to the upper one of the two gate lines 121. Each storage electrode line 131 includes storage electrodes 137 extending longitudinally from the electrode line 131 in an upward and/or downward direction. However, the shapes and disposition of the storage electrode lines 131 and the storage electrodes 137 may be modified in various ways.

An upper interlayer insulating layer 140 made of an organic material and having a plurality of openings 144 and a plurality of contact holes 141 and 143 is formed on the gate lines 121, the lower interlayer insulating layer 160, the storage electrode 137 and the storage electrode lines 131.

Gate insulators 146 are formed in the openings 144 of the upper interlayer insulating layer 140. A plurality of source electrodes 193, a plurality of pixel electrodes 191 including drain electrodes 195, and a plurality of contact assistants 81 and 82 are formed on the upper interlayer insulating layer 140 and the gate insulators 146.

Unlike the previously described exemplary embodiment, an OTFT array panel according to the present exemplary embodiment includes storage electrode lines 131 formed parallel to the gate lines 121. The present exemplary embodiment also includes a storage electrode line 131, a pixel electrode 191 and an upper interlayer insulating layer interposed therebetween to form a storage capacitor.

As mentioned above, by forming storage electrode lines 131 overlapping the pixel electrodes 191, the liquid crystal capacitor is supplemented so that storage capacitance can be increased. Consequently, the decrease of an on/off current ratio (I-on/I-off) due to a material limit of the organic semiconductors can be complemented.

A plurality of insulating banks 180 having a plurality of openings 184 are formed on the source electrodes 193, the pixel electrodes 191, and the upper interlayer insulating layer 140.

A plurality of organic semiconductor islands 154 are formed in the opening 184 of the insulating banks 180, and stoppers 186 are formed on the organic semiconductor islands 154.

Exemplary Embodiment 3

Figure 15:
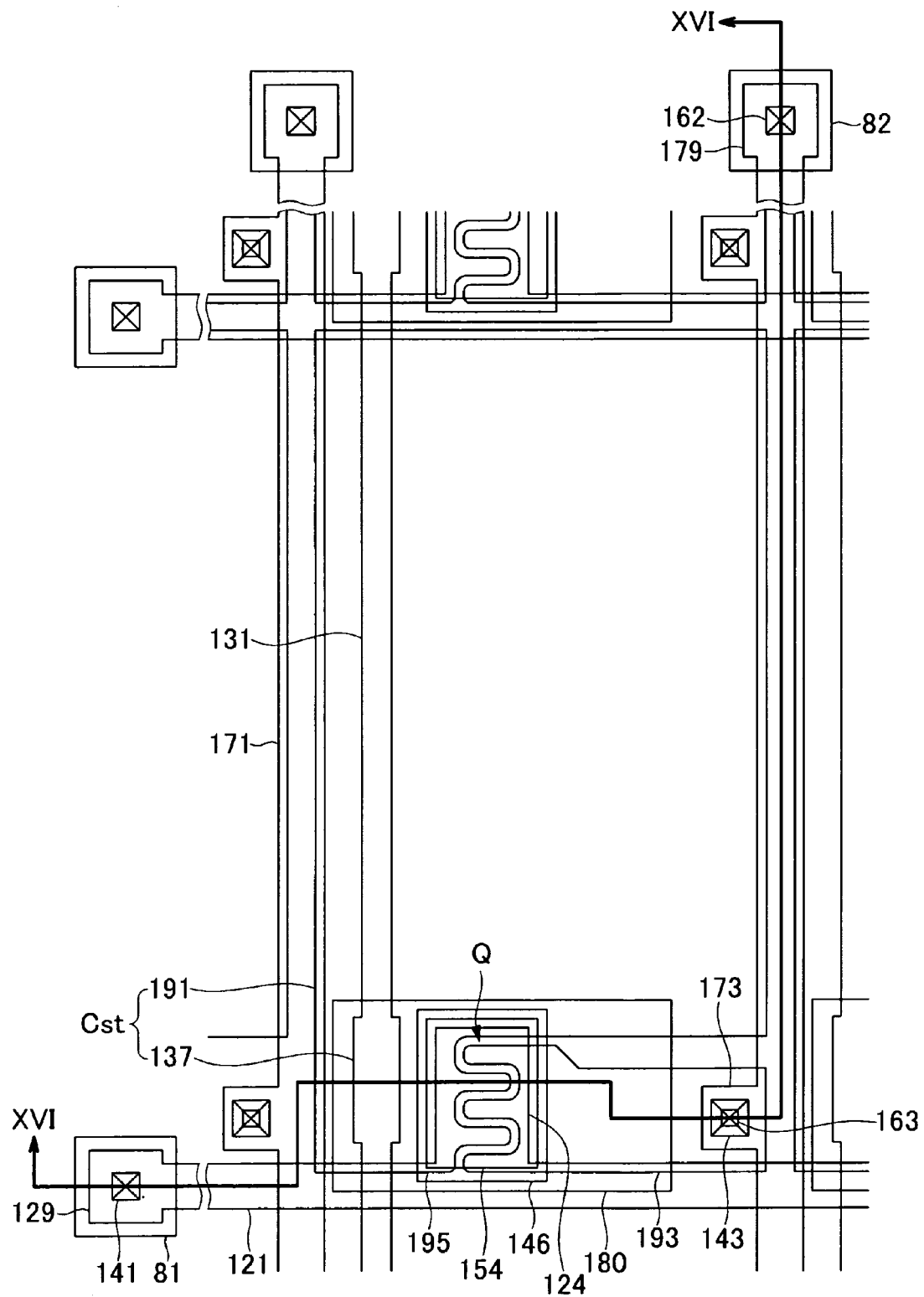
FIG. 15 is a top plan view layout of an exemplary embodiment of an OTFT array panel according to the present invention.
Figure 16:
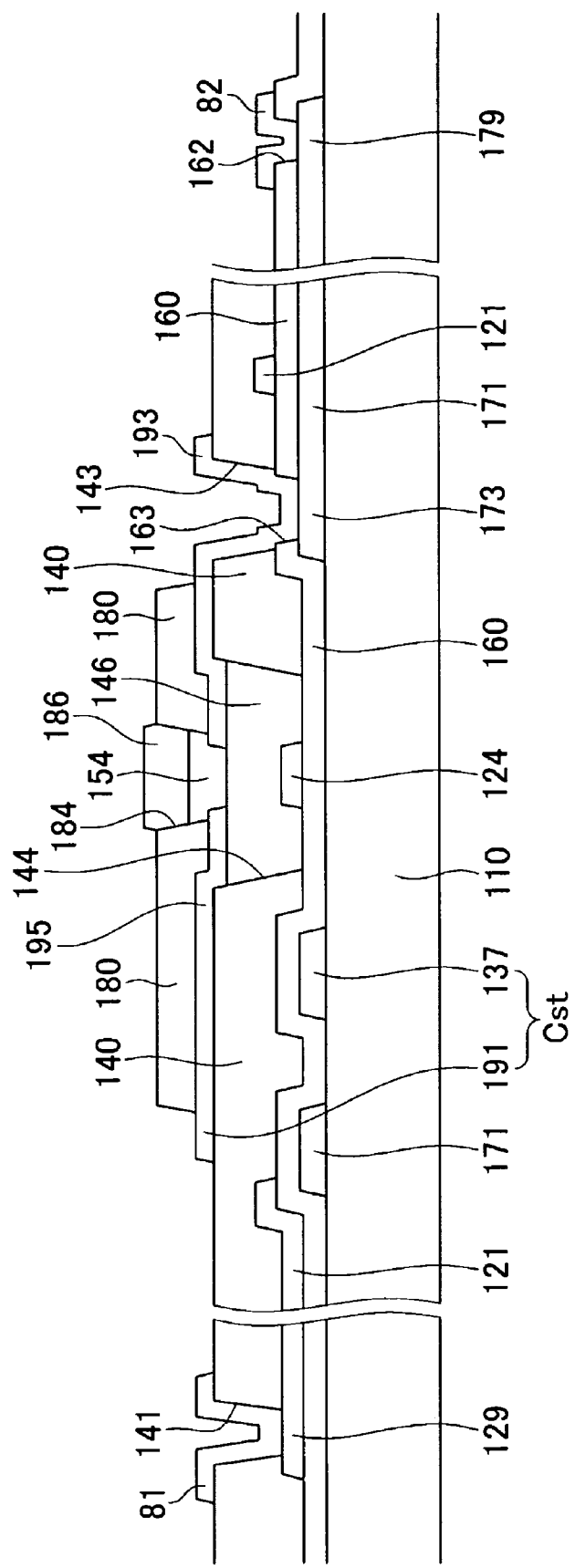
FIG. 16 is a cross-sectional view of the exemplary embodiment of an OTFT array panel shown in FIG. 15 taken along line XVI-XVI.

An OTFT array panel according to a further exemplary embodiment is illustrated in FIG. 15 and FIG. 16.

FIG. 15 is a top plan view layout of an exemplary embodiment of an OTFT array panel according to the present invention, and FIG. 16 is a cross-sectional view of the exemplary embodiment of an OTFT array panel shown in FIG. 15 taken along line XVI-XVI.

As illustrated in FIG. 15 and FIG. 16, the OTFT array panel has the same structure as the previously described first exemplary embodiment except for storage electrode lines 131.

According to the present exemplary embodiment, storage electrode lines 131 are formed parallel to the data lines 171, and each storage electrode line 131 includes storage electrodes 137 extending laterally to both sides. Each storage electrode line 131 overlaps a pixel electrode 191 to form a storage capacitor with the lower interlayer insulating layer 160 and the upper interlayer insulating layer 140 interposed between the storage electrode line 131 and the pixel electrode 191. Here, the lower interlayer insulating layer 160 is made of an inorganic material such as silicon nitride or silicon oxide, and the upper interlayer insulating layer 140 may be made of one or more of the organic materials described above.

In the present exemplary embodiment, a storage capacitor can be formed to include the lower interlayer insulating layer 160 made of an inorganic material and the upper interlayer insulating layer 140 made of an organic material.

Although preferred embodiments of the present invention have been described in detail hereinabove, it should be clearly understood that many variations and/or modifications of the basic inventive concepts herein taught, which may appear to those skilled in the present art, will still fall within the spirit and scope of the present invention, as defined in the appended claims.

What is claimed is:

1. An organic thin film transistor array panel comprising:
a substrate;
a data line formed on the substrate;
a lower interlayer insulating layer formed on the data line;
a gate line formed on the lower interlayer insulating layer, wherein the gate line intersects the data line and includes a gate electrode;
an upper interlayer insulating layer formed on the gate line and the data line and having a first opening exposing the gate electrode;
a gate insulator formed in the first opening;

a source electrode disposed on the gate insulator and connected to the data line;

a drain electrode opposing the source electrode;

a pixel electrode disposed on the upper interlayer insulating layer and integrated with the drain electrode;

an insulating bank formed on the source electrode and the drain electrode, the insulating bank defining a second opening which exposes portions of the gate insulator, the source electrode and the drain electrode; and an organic semiconductor formed in the second opening.

2. The organic thin film transistor array panel of claim 1, wherein the second opening is smaller than the first opening.

3. The organic thin film transistor array panel of claim 1, wherein the dielectric constant of the gate insulator is greater than the dielectric constant of the upper interlayer insulating layer.

4. The organic thin film transistor array panel of claim 3, wherein the gate insulator comprises at least one selected from the group consisting of a polyimide, a polyvinyl alcohol and a fluorane-containing compound.

5. The organic thin film transistor array panel of claim 3, wherein the upper interlayer insulating layer comprises at least one selected from the group consisting of a polyacryl, a polystyrene, silicon oxide, silicon nitride, benzocyclobutane, and parylene.

6. The organic thin film transistor array panel of claim 1, further comprising a stopper formed on the organic semiconductor.

7. The organic thin film transistor array panel of claim 6, wherein the stopper comprises a fluorine-containing hydrocarbon compound or a polyvinyl alcohol.

8. The organic thin film transistor array panel of claim 1, further comprising a storage electrode line including a portion at least partially overlapping the pixel electrode, the storage electrode line extending parallel to one of the data line and the gate line.

9. The organic thin film transistor array panel of claim 8, wherein the upper interlayer insulating layer is partially removed above the storage electrode.

10. The organic thin film transistor array panel of claim 9, wherein the lower interlayer insulating layer disposed between the storage electrode line and the pixel electrode.

11. The organic thin film transistor array panel of claim 10, wherein the upper interlayer insulating layer comprises an organic material and the lower interlayer insulating layer comprises an inorganic material.

12. The organic thin film transistor array panel of claim 8, further comprising a conductor connected to the pixel electrode and overlapping a portion of the storage electrode line.

13. The organic thin film transistor array panel of claim 1, wherein at least one of the upper interlayer insulating layer, the gate insulator, the insulating bank, and the organic semiconductor comprises a soluble material.

14. The organic thin film transistor array panel of claim 1, wherein at least one of the upper interlayer insulating layer and the insulating bank comprises a photosensitive organic material.

15. The organic thin film transistor array panel of claim 1, wherein the source electrode and the pixel electrode comprises indium tin oxide or indium zinc oxide.

* * * * *